United States Patent
Wang et al.

(10) Patent No.: US 12,278,127 B2
(45) Date of Patent: Apr. 15, 2025

(54) AUTO FINE-TUNER FOR DESIRED TEMPERATURE PROFILE

(71) Applicant: Applied Materials, Inc., Santa Clara, CA (US)

(72) Inventors: Yi Wang, Santa Clara, CA (US); Wolfgang Aderhold, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 375 days.

(21) Appl. No.: 17/835,711

(22) Filed: Jun. 8, 2022

(65) Prior Publication Data

US 2023/0402305 A1  Dec. 14, 2023

(51) Int. Cl.
*H01L 21/67* (2006.01)

(52) U.S. Cl.
CPC .. *H01L 21/67248* (2013.01); *H01L 21/67115* (2013.01)

(58) Field of Classification Search
CPC ......... H01L 21/67103; H01L 21/67115; H01L 21/67248
See application file for complete search history.

(56) References Cited

U.S. PATENT DOCUMENTS

| | | |
|---|---|---|
| 6,855,916 B1 * | 2/2005 | Matthews ......... H01L 21/67109 118/724 |
| 2006/0031788 A1 | 2/2006 | Bauer |
| 2006/0228818 A1 | 10/2006 | Chacin et al. |
| 2007/0010033 A1 | 1/2007 | Aderhold et al. |
| 2010/0124249 A1 | 5/2010 | Aderhold et al. |
| 2015/0170934 A1 | 6/2015 | Aderhold |

OTHER PUBLICATIONS

International Search Report and Written Opinion from PCT/US2023/021326 dated Aug. 28, 2023, 8 pgs.
International Preliminary Report on Patentability for International Application No. PCT/US2023/021326; dated Dec. 19, 2024; 5 pgs.

* cited by examiner

*Primary Examiner* — Walter H Swanson
(74) *Attorney, Agent, or Firm* — Schwabe, Williamson & Wyatt, P.C.

(57) ABSTRACT

Embodiments disclosed herein include a method of setting a target profile. In an embodiment, the method comprises obtaining a first gain curve for one or more temperature sensor offsets, and obtaining a second gain curve for one or more zone multipliers. In an embodiment, the method further comprises combining the first gain curve and the second gain curve into a thermal model. In an embodiment, the method further comprises obtaining a reference data set, and using the thermal model to generate temperature sensor offsets and/or zone multipliers to apply to the reference data set in order to generate the target profile.

13 Claims, 7 Drawing Sheets

AUTO FINE-TUNER FOR DESIRED TEMPERATURE PROFILE

BACKGROUND

1) Field

Embodiments relate to the field of semiconductor manufacturing and, in particular, processes and apparatuses for implementing temperature profile tuning.

2) Description of Related Art

Thermal oxidation processes are typically implemented on a rapid thermal processing (RTP) tool. An RTP tool includes an array of lamps that are used to heat the underlying substrate. In many modern RTP tools, the lamps are controlled in a plurality of zones. The zones typically extend out radially from the center of the RTP tool. For example, three or more lamp zones may be used in some implementations. Additionally, the control of the heating can be informed by feedback provided by one or more temperature sensors, such as pyrometers. In some instances, the number of pyrometers is different than the number of lamp zones. That is, a single pyrometer may be used to measure temperatures corresponding to more than one lamp zone. As such, the resolution of the temperature control may be sub-optimal.

In a particular instance, it is desirable to have a center flat temperature profile. A center flat temperature profile refers to the temperature across the center portion of the substrate that is substantially flat. A center flat temperature profile may result in an oxide thickness that is relatively constant across the center of the substrate. However, since a single pyrometer is used to provide feedback control to the center of the substrate, the lamp zones at the center of the substrate do not have individual feedback control. As such, it is difficult to provide a center flat profile. Similarly, it is difficult to enable other temperature profiles (e.g., edge cold, or edge hot) using existing solutions.

SUMMARY

Embodiments disclosed herein include a method of setting a target profile. In an embodiment, the method comprises obtaining a first gain curve for one or more temperature sensor offsets, and obtaining a second gain curve for one or more zone multipliers. In an embodiment, the method further comprises combining the first gain curve and the second gain curve into a thermal model. In an embodiment, the method further comprises obtaining a reference data set, and using the thermal model to generate temperature sensor offsets and/or zone multipliers to apply to the reference data set in order to generate the target profile.

Embodiments disclosed herein may also comprise a semiconductor processing tool. In an embodiment, the semiconductor processing tool may comprise a processing chamber, an array of lamps over the processing chamber, wherein the array of lamps comprise a plurality of lamp zones, and a plurality of temperature sensors, wherein a number of temperature sensors is less than a number of lamp zones. In an embodiment the semiconductor processing tool may further comprise a thermal model to generate temperature sensor offsets and/or zone multipliers configured to generate a target temperature profile.

Embodiments disclosed herein may also include a method for setting a target temperature profile in a thermal processing chamber. In an embodiment, the method may comprise obtaining a first gain curve for one or more temperature sensor offsets of a plurality of temperature sensors, and obtaining a second gain curve for one or more zone multipliers for a plurality of lamp zones, wherein a number of zone multipliers is greater than a number of temperature sensors. In an embodiment, the method may further comprise combining the first gain curve and the second gain curve into a thermal model, obtaining a reference data set, and using the thermal model to generate temperature sensor offsets and/or zone multipliers to apply to the reference data set in order to generate the target temperature profile.

DETAILED DESCRIPTION

Figure 1:
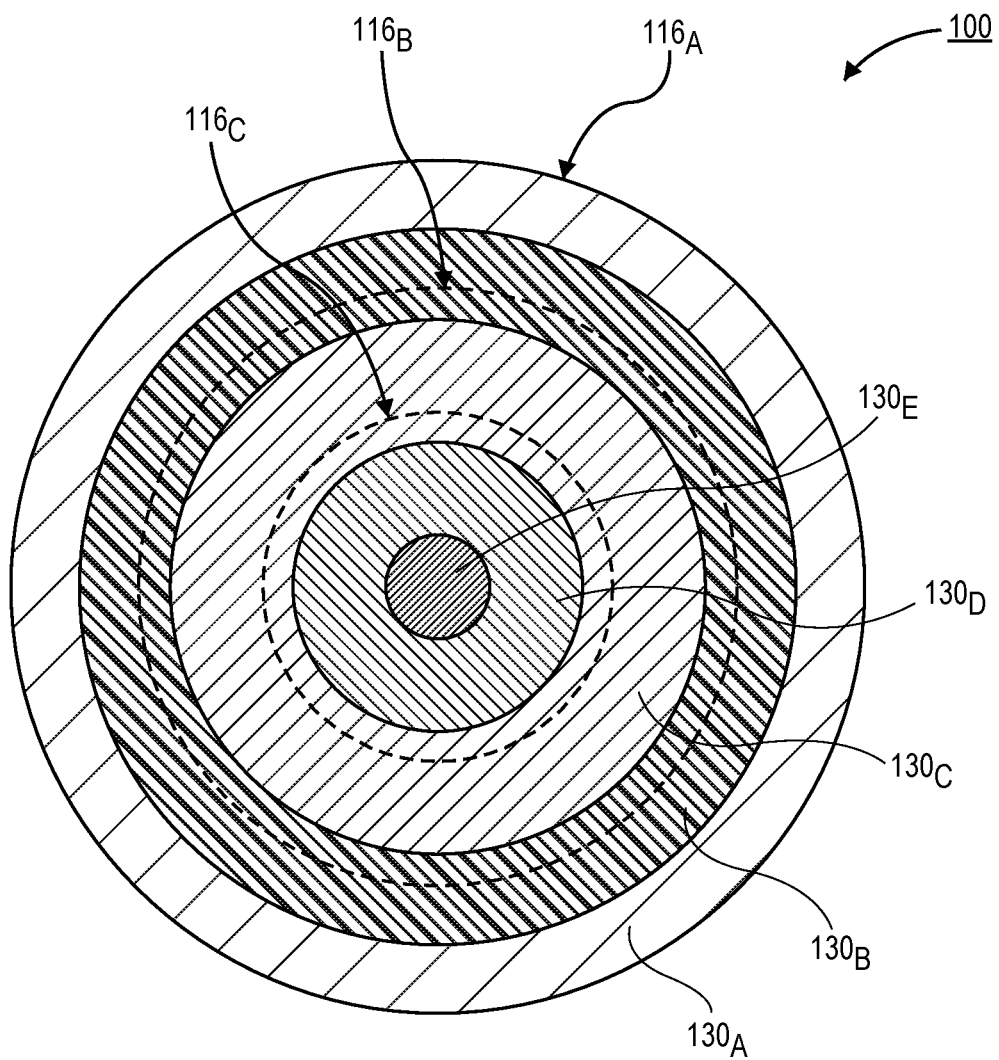
FIG. 1 is a plan view illustration of a lamp array with a plurality of concentric lamp zones with pyrometer zones overlaid on the lamp zones, in accordance with an embodiment.

Systems described herein include processes and apparatuses for implementing temperature profile tuning. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, it is currently difficult to control the temperature profile of rapid thermal processing (RTP) tools. This is due in part to the difference in a number of lamp zones and a number of temperature sensor zones. When the number of temperature sensor zones is less than a number of lamp zones, the temperature sensor zones must overlap two or more lamp zones. This results in temperature feedback being uniformly applied to multiple lamp zones, even when the temperatures obtained by the various lamp zones are different. In a particular instance, this makes it difficult to provide a center flat temperature profile. Other profiles (e.g., edge hot or edge cold) may also be difficult to obtain using existing control processes.

As used herein, a "center flat" profile may refer to a profile where a center region of the substrate has a substantially flat temperature profile. It is to be appreciated that the center region will typically not have a perfectly flat temperature profile, but the general shape of the profile may be flat. For example, a trend line of the center region may generally be substantially parallel to the X-axis (e.g., within fifteen degrees of being parallel to the X-axis). While described with respect to temperature, it is to be appreciated that a "center flat" profile (or other profiles) may also apply to a thickness profile in some instances. In such a thickness profile, the center region of the substrate may have a film (e.g., an oxide film) that has a substantially uniform thickness. Generally, a thickness profile of a film will substantially match the temperature profile used to form the film.

As used herein, an "edge hot" profile may refer to a temperature profile where an edge temperature is higher than a center temperature, and an "edge cold" profile may refer to a temperature profile where an edge temperature is lower than a center temperature. While specific profiles are described (e.g., center flat, edge hot, and edge cold), it is to be appreciated that embodiments disclosed herein can be tailored in order to generate any needed temperature or thickness profile.

In order to improve the resolution of the control of a temperature profile, embodiments disclosed herein include the use of both temperature offsets and zone multipliers. A temperature offset may be an offset that is applied to a measured temperature (e.g., that is measured by a pyrometer). The temperature offset may be used to locally increase or decrease the value of the measured temperature. A zone multiplier may be a gain value that is applied to the power of a lamp zone. For example, the power supplied to a lamp zone may be increased or decreased by a certain percentage. Accordingly, instead of having a single variable to control the temperature profile, a plurality of knobs are able to be used in order to tune the temperature profile to provide a desired result.

In an embodiment, the process to generate a desired temperature profile may include obtaining a first gain curve and a second gain curve. The first gain curve may include one or more temperature offsets, and the second gain curve may include one or more zone multipliers. The first and second gain curves may be determined by performing metrology on one or more substrates that are processed with various temperature offsets and zone multipliers. The first and second gain curves may then be combined and integrated into a thermal model. The thermal model may be a physics based model that maps the thermal performance of an RTP tool. In an embodiment, the process may then continue with obtaining a reference data set. For example, the reference data set may be provided by metrology of a previously processed substrate. In an embodiment, the process may then continue with using the thermal model to generate temperature sensor offsets and/or zone multipliers to apply to the reference data set in order to generate the target profile.

Referring now to FIG. 1, a schematic illustration of a lamp array of a RTP tool 100 is shown, in accordance with an embodiment. The RTP tool 100 may be used to form layers on a substrate (not shown). For example, an oxide layer may be formed on the substrate. In other embodiments, the RTP tool 100 may be used for annealing processes. In an embodiment, the lamp array may include a plurality of lamp zones 130. For example, lamp zones $130_A$-$130_E$ are shown in FIG. 1. However, it is to be appreciated that the tool 100 may include any number of lamp zones 130. For example, the tool 100 may include twelve or more lamp zones in some embodiments.

The lamp zones 130 may be substantially concentric regions. A central lamp zone $130_E$ may be substantially circular, and the remaining lamp zones $130_A$-$130_D$ may be concentric rings around the central lamp zone $130_E$. Each lamp zone 130 may include a plurality of individual lamps (not shown). In some embodiments, the lamp zones 130 may have non-uniform numbers of lamps. For example, the number of lamps in the central lamp zone $130_E$ may be different than a number of lamps in lamp zone $130_D$.

In an embodiment, the RTP tool 100 may also include one or more temperature sensing regions 116. For example, three temperature sensing regions $116_A$-$116_C$ are shown in FIG. 1. The temperature sensing regions 116 may include a central region $116_C$, a middle region $116_B$, and an outer region $116_A$. The central region $116_C$ may be used to provide feedback control to a region from the center of the tool 100 to the first dashed line, the middle region 1168 may be used to provide feedback control between the first dashed line and the second dashed line, and the outer region $116_A$ may be used to provide feedback control between the second dashed line and an outer perimeter of the tool 100. Each region $116_A$-$116_C$ may include a single temperature sensor. In an embodiment, the temperature sensors may be any temperature sensor architecture. For example, the temperature sensors may be pyrometers or the like.

As shown, the number of lamp zones 130 is different than the number of temperature sensor regions 116. Particularly, the number of lamp zones 130 is greater than the number of temperature sensor regions 116. Accordingly, each of the temperature sensing regions 116 may be used to provide feedback to two or more lamp zones 130. When the only feedback source is the temperature sensing regions 116, it is difficult to provide high resolution control of the temperature profile (and the corresponding film thickness profile). Therefore, embodiments disclosed herein use both temperature offsets and zone multipliers in order to provide a desired profile in the tool 100. Temperature offsets and zone multipliers will be described in greater detail below.

Figure 2:
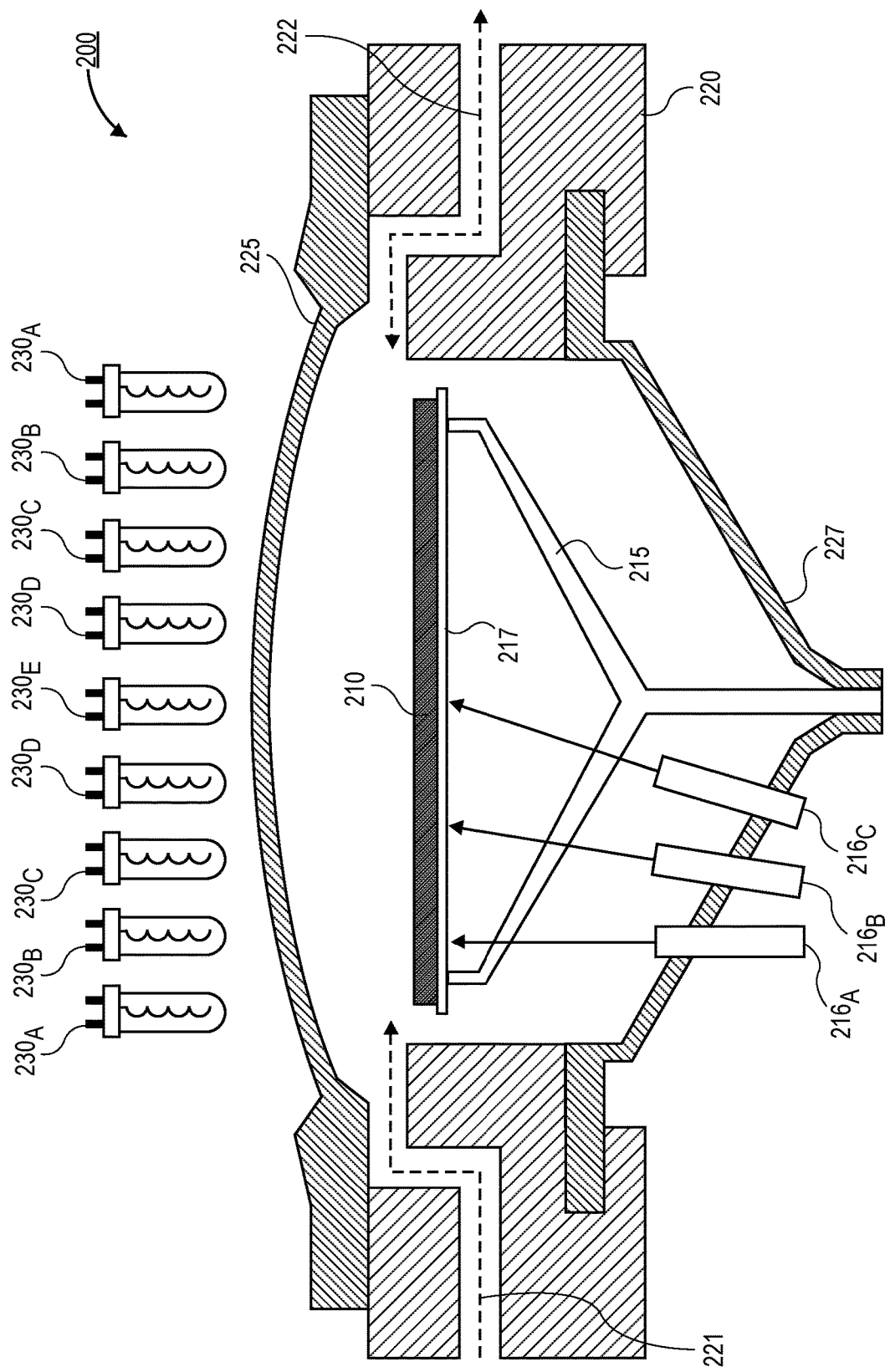
FIG. 2 is a cross-sectional illustration of a rapid thermal processing (RTP) tool with a plurality of lamp zones and a plurality of pyrometer zones, in accordance with an embodiment.

Referring now to FIG. 2, a cross-sectional illustration of a processing chamber 200 is shown, in accordance with an embodiment. In an embodiment, the chamber 200 may comprise any type of semiconductor manufacturing chamber that may require precise substrate temperature control. In the illustrated embodiment, a chamber 200 without plasma capability is shown. However, it is to be appreciated that the chamber 200 may also comprise the capability to use a plasma in order to implement various processing regimes.

In an embodiment, the chamber 200 may comprise a chamber body 220. The chamber body 220 may include any suitable material, such as stainless steel, or the like. In an embodiment, a coating (not shown) may be provided over an interior surface of the chamber body 220. For example, the coating may be a chamber seasoning or protection layer. In an embodiment, gas 221 may enter the chamber 200 through a first portion of the chamber body 220, and gas 222 may exit the tool through a second portion of the chamber body 220. While the gas 221 and 222 are shown entering and exiting through the chamber body 220, it is to be appreciated that the gas may enter or exit the chamber through any portion of the chamber 200, depending on the type of chamber 200 that is being used.

In an embodiment, a substrate support 215 and a susceptor 217 are provided in the chamber. The substrate support 215 and the susceptor 217 are configured to hold and/or secure a substrate 210. For example, the substrate 210 may be a semiconductor substrate, such as a silicon wafer. The substrate 210 may have any suitable form factor. For example, a diameter of the substrate 210 may be 300 mm, 450 mm, or any standard wafer form factor. Additionally, other substrates 210 may be used in the chamber 200. For example, glass substrates, ceramic substrates, or the like may also be used in some embodiments. In an embodiment, the substrate support 215 and the susceptor 217 may be configured to rotate. The rotation allows for improved temperature uniformity across the substrate 210.

The susceptor 217 may include any type of chucking architecture in order to secure the substrate 210. In some embodiments, the susceptor 217 may include an electrostatic chucking (ESC) architecture. In such an embodiment, the substrate 210 is secured to the susceptor 217 by an electrostatic force. Other embodiments may include a vacuum chucking architecture for the susceptor 217. In an embodiment, the susceptor 217 and the substrate support 215 may comprise a quartz material or another material that is at least substantially transparent to infrared radiation. As such, a temperature of the backside surface of the substrate 210 can obtained by pyrometers 216.

In an embodiment, the chamber 200 may include a lid 225. The lid 225 may sometimes be referred to as a chamber dome. While shaped as a dome, it is to be appreciated that lid 225 may have any architecture (e.g., a flat surface or the like). The lid 225 may be formed from a material that is at least substantially transparent to infrared radiation. For example, the lid 225 may comprise quartz or the like.

In an embodiment, the chamber 200 may also include a bottom lid 227. The bottom lid 227 may cover a bottom surface of the chamber 285. The bottom lid 227 may comprise a material that is at least substantially transparent to infrared radiation. As such, pyrometers 216 on the bottom side of the chamber 200 can be used to measure a temperature of a bottom surface of the substrate 210. In an embodiment, the bottom lid 227 may be coupled to the substrate support 215. More particularly, the substrate support 215 may pass through the bottom lid 227. The bottom lid 227 is coupled to the substrate support 215 in a configuration that allows for the substrate support 215 to freely rotate.

In an embodiment, a plurality of lamps 230 may be provided outside the internal volume of the chamber 200. The internal volume of the tool may refer to the volume defined by the lid 225, the chamber body 220, and the bottom lid 227. That is, the lamps 230 are not provided within the internal volume of the chamber 200 where the substrate processing is implemented. In the illustrated embodiment, five sets of lamps $230_A$-$230_E$ are provided over a top surface of the lid 225. Each of the lamps $230_A$-$230_E$ represent different lamp regions. Lamps $230_A$ may be for an outer zone of the substrate 210, lamps $230_B$-$230_D$ may be for middle zones of the substrate 210, and lamp $230_E$ may be for a central zone of the substrate 210. The lamps $230_A$-$230_E$ may be focused on the different zones by a reflector (not shown) that is provided around the lamps 230. While one or two lamps 230 are shown for each zone, it is to be appreciated that any number of lamps may be used to heat each zone of the substrate 210. In the illustrated embodiment, five front-side lamp zones are shown. However, it is to be appreciated that more than five lamp zones may be included in other embodiments. For example, the reflector structure may include six or more zones in order to provide even more enhanced control of the temperature across the surface of the substrate 210.

In an embodiment, the plurality of pyrometers $216_A$-$216_C$ may be provided through the bottom lid 227. The pyrometers 216 may be focused onto the backside surface of the substrate 210. In an embodiment, the number of pyrometers 216 may be different than the number of heating zones on the substrate 210. For example, five heating zones are shown in FIG. 2, and three pyrometers $216_A$-$216_C$ are provided. The pyrometer $216_A$ may measure temperature at an outer region of the substrate 210, the pyrometer $216_B$ may measure temperature at a middle region of the substrate 210, and the pyrometer $216_C$ may measure temperature at a central region of the substrate 210.

Figure 3:
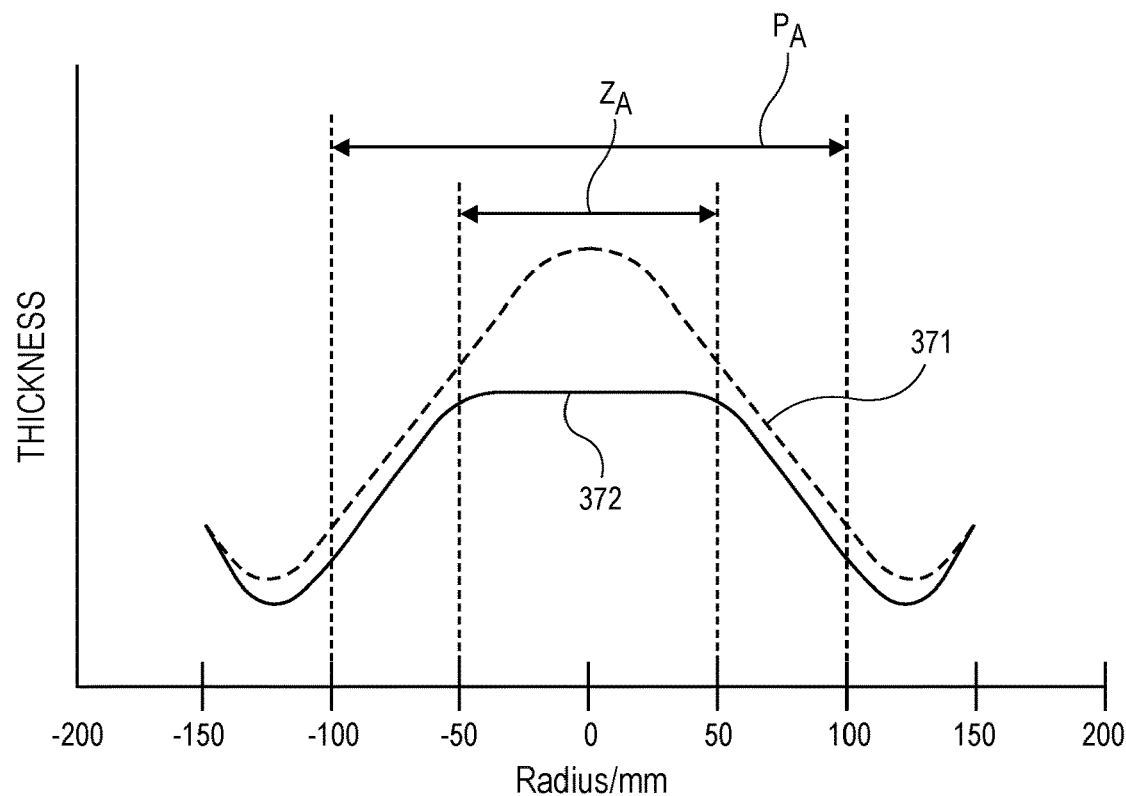
FIG. 3 is a graph illustrating a thickness profile of a sub-optimally controlled process, and a process that enables a center flat thickness profile, in accordance with an embodiment.

Referring now to FIG. 3, a graph of thickness profiles of a first substrate 371 and a second substrate 372 are shown, in accordance with an embodiment. The first substrate 371 is fabricated with existing feedback and controller architectures. As shown, the center region (e.g., between −50 mm and 50 mm) has a significant peak. This is in part due to the breadth of the first pyrometer zone $P_A$. As shown, the first pyrometer zone $P_A$ extends from approximately −100 mm to 100 mm. This is significantly wider than the breadth of the first lamp zone $Z_A$. The first lamp zone $Z_A$ may be from approximately −50 mm to 50 mm. However, there is no feedback control specifically for the narrower first lamp zone $Z_A$. This prevents the ability to reduce the thickness of the center region of the first substrate 371.

In contrast the second substrate 372 includes a center flat profile. That is, the trend line of the second substrate 372 at the middle region is substantially parallel to the X-axis. The second substrate 372 is able to form this desirable profile through the use of embodiments disclosed herein. Particularly, both temperature offsets (for the pyrometers) and zone multipliers (for each lamp zone) may be used in combination in order to provide higher resolution control of the profile. That is, the center region can still be flat even though the temperature feedback from $P_A$ is wider than the center region. This is because the zone multiplier for the center lamp $Z_A$ can be used to decrease the thermal energy supplied to the center region.

More particularly, gain curves are plotted for both the temperature sensor offsets and the zone multipliers for each of the lamp zones. That is, a recording of the change that is attributable to certain temperature offsets or zone multipliers can be obtained as gain curves. The gain curves can then be applied to thermal models in order to generate the necessary offsets in order to produce a particular profile.

Figure 4A:
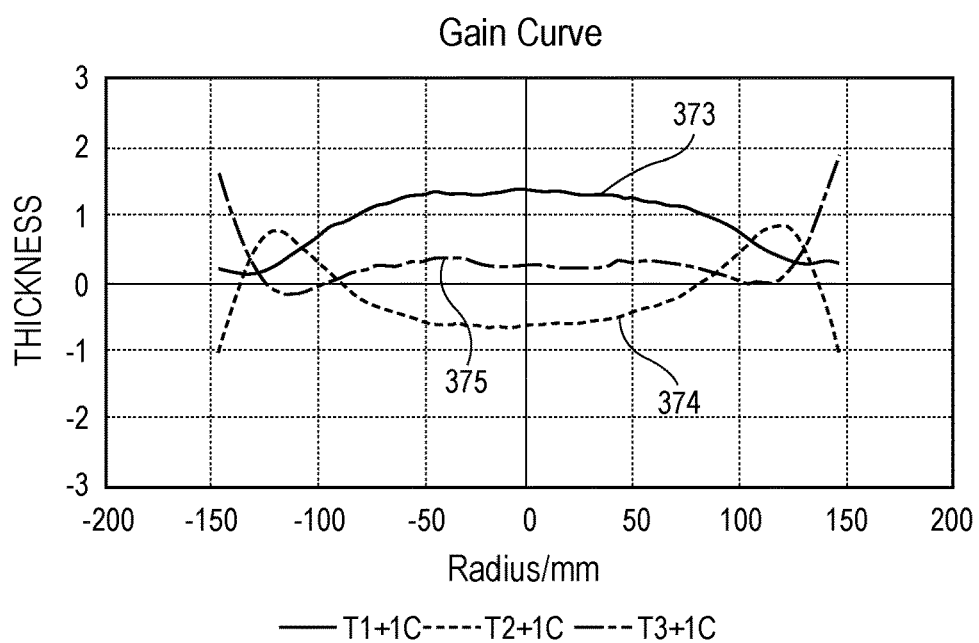
FIG. 4A is a graph of pyrometer gain curves with each pyrometer zone having a one degree temperature offset, in accordance with an embodiment.

Referring now to FIG. 4A, a graph of the gain curves for various temperature offsets is shown, in accordance with an embodiment. Each of the gain curves corresponds to one of the temperature sensors in the tool 100. For example, three gain curves are shown in FIG. 4A. Gain curve 373 is for the center pyrometer (T1), gain curve 374 is for a middle pyrometer (T2), and gain curve 375 is for an outer pyrometer (T3). As shown in FIG. 4A, each of the pyrometers is given an offset of 1° C.

Each of the gain curves may represent the change in the profile attributable to the offset. That is, each gain curve 373-375 may be generated by processing different substrates and taking metrology of those substrates. Each substrate is processed using one of the three offsets. For example, curve 373 shows the profile if the center pyrometer T1 is given an offset of 1° C. and the other pyrometers T2 and T3 are left unmodified. Curve 374 shows the profile if the middle pyrometer T2 is given an offset of 1° C. and the other pyrometers T1 and T3 are left unmodified. Curve 375 shows the profile if the outer pyrometer T3 is given an offset of 1° C. and the other pyrometers T1 and T2 are left unmodified. As shown, the offsets generally correspond to increased thicknesses in the modified region. For example, the profile of the center region is increased on line 373, the profile of the middle region is increased on line 374, and a profile of the outer region is increased on line 375.

Figure 4B:
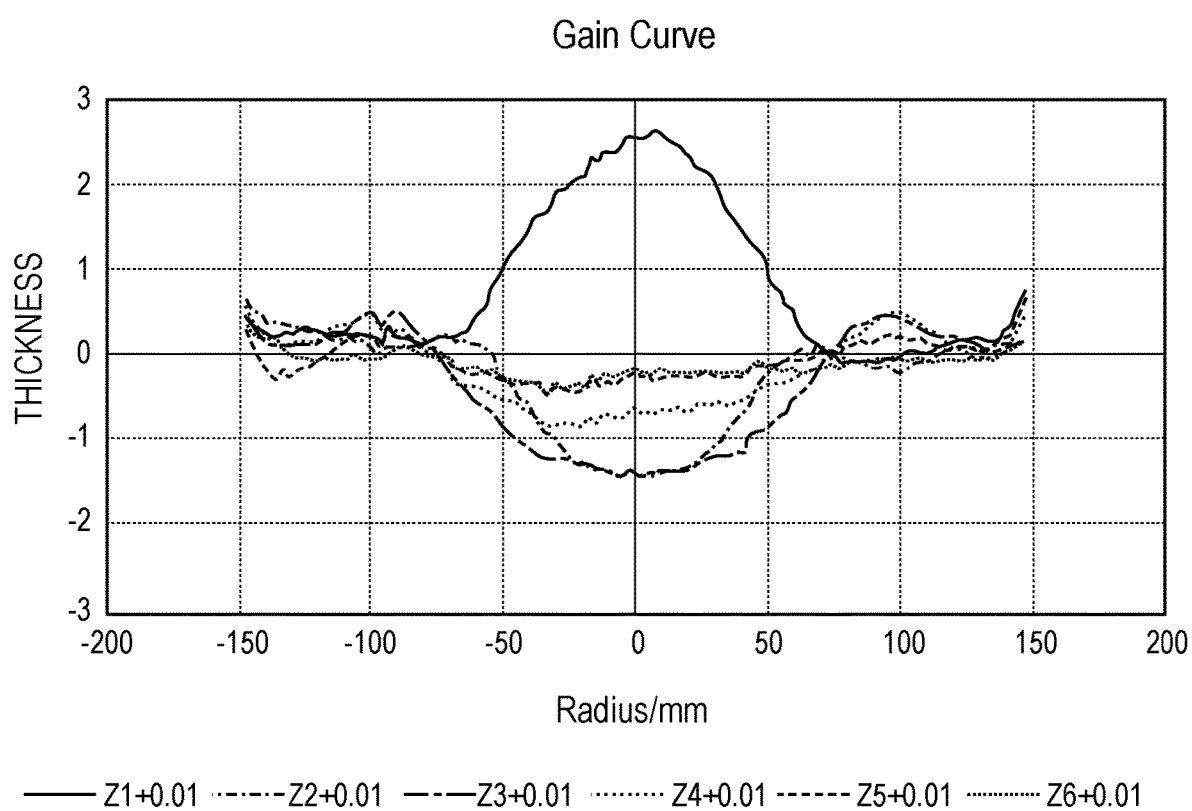
FIG. 4B is a graph of zone multiplier gain curves with each lamp zone multiplied by zone multiplier of 0.01, in accordance with an embodiment.

Referring now to FIG. 4B, a graph of the gain curves for various zone multipliers is shown, in accordance with an embodiment. Each of the gain curves corresponds to one of the lamp zones in the tool 100. For example, six gain curves are shown in FIG. 4B. As shown in FIG. 4B, each of the zones has a zone multiplier of +0.01. Zone 1 (Z1) may be at a center of the tool 100, and zone 6 (Z6) may be at an outer edge of the tool 100. Zones 2-5 (Z2-Z5) may be provided between zone 1 and zone 6.

Each of the gain curves may represent the change in the profile attributable to the zone multiplier. That is, each gain curve Z1-Z6 may be generated by processing different substrates and taking metrology of those substrates. Each substrate is processed using one of the six zone multipliers. For example, curve Z1 shows the profile if the center lamp zone is given a zone multiplier of +0.01 and the other lamp zones Z2-Z6 are left unmodified. As shown, the zone multipliers generally correspond to increased thicknesses in the modified region. For example, the profile of the center region is increased on the center zone Z1 and increases towards the edge are observed on the outer zones (e.g., Z6).

Figure 5:
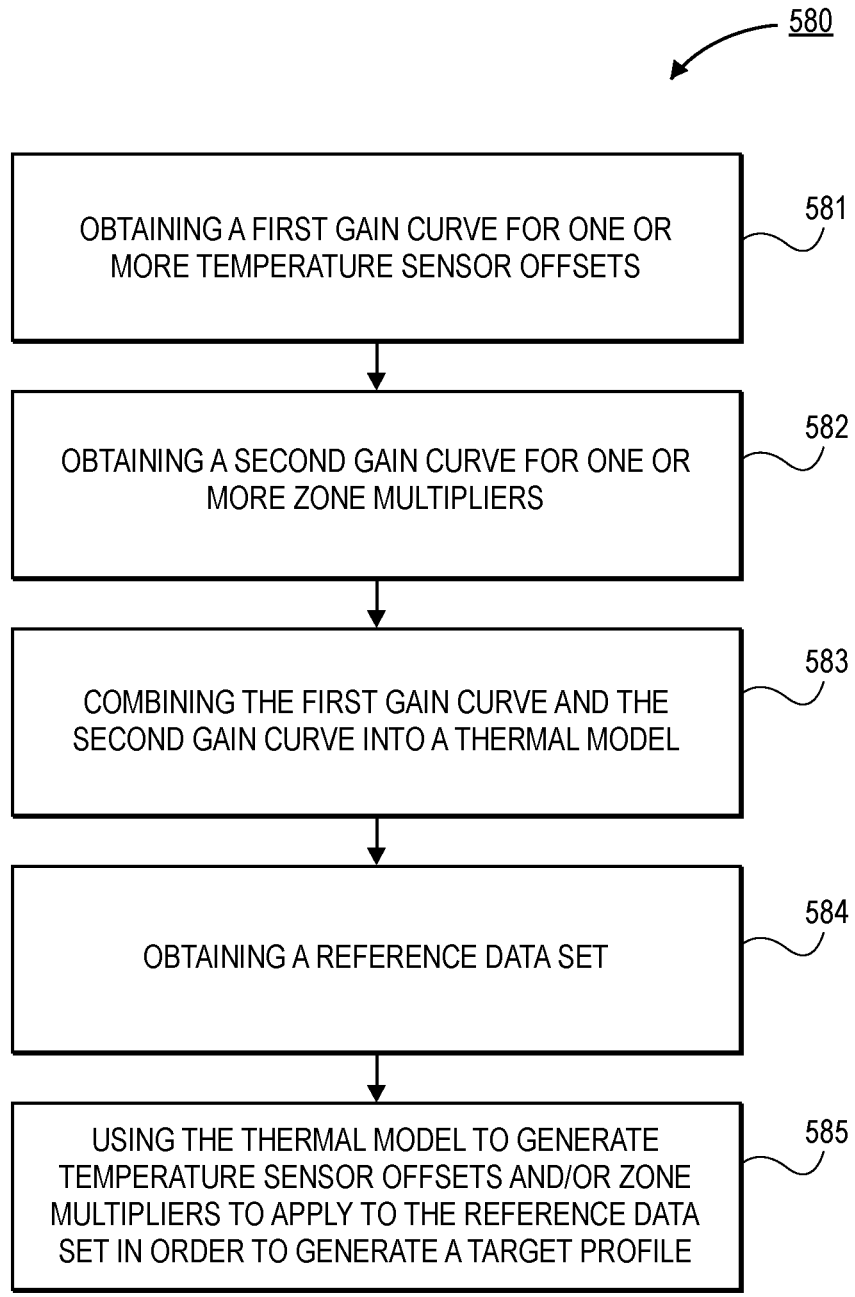
FIG. 5 is a process flow diagram of a process for generating a target profile for a RTP operation, in accordance with an embodiment.

Referring now to FIG. 5, a flow diagram of a process 580 for generating a target profile is shown, in accordance with an embodiment. In an embodiment, the target profile may be a temperature profile, a film thickness profile, or the like. In some embodiments, the target profile may be a center flat profile, an edge hot profile, an edge cold profile, or any other profile necessary for processing substrates.

In an embodiment, process 580 may begin with operation 581, which comprises obtaining a first gain curve for one or more temperature sensor offsets. In an embodiment, there may be three or more temperature sensors to which gain curves can be provided. In an embodiment, each of the first gain curves may be obtained using a process similar to the process described above with respect to FIG. 4A. That is, a temperature offset may be applied to one of the temperature sensors and the remaining temperature sensors are left unmodified. A substrate may be processed under such conditions and metrology (e.g., film thickness) of the substrate is provided. Each of the of the temperature sensors may be investigated with such a process in order to provide a set of gain curves for temperature offsets.

In an embodiment, process 580 may continue with operation 582, which comprises obtaining a second gain curve for one or more zone multipliers. Each zone multiplier may be applied to a different lamp zone. In an embodiment, the number of lamp zones may be greater than the number of temperature sensors. For example, the number of lamp zones may be four or more lamp zones. In an embodiment, each of the second gain curves may be obtained using a process similar to the process described above with respect to FIG. 4B. That is, a zone multiplier may be applied to an individual lamp zone and the remaining lamp zones are unmodified. A substrate may be processed under such conditions and metrology (e.g., film thickness) of the substrate is provided. Each of the of the lamp zones may be investigated with such a process in order to provide a set of gain curves for zone multipliers.

In an embodiment, the process 580 may continue with operation 583, which comprises combining the first gain curves and the second gain curves into a thermal model. In an embodiment, the thermal model may include a physics based model of the thermal properties of the tool 100. For example, heat transfer equations, other physical properties, and the like may be used to determine outcomes on the substrate. In a particular embodiment, the data obtained from the first gain curves and the second gain curves can be used to improve the accuracy of the thermal model.

In an embodiment, the process 580 may continue with operation 584, which comprises obtaining a reference data set. In an embodiment, the reference data set may be obtained by performing metrology on a substrate that has been processed with an existing recipe. In other embodiments (e.g., in future iterations of the process 580) the reference data set may be obtained from the thermal model itself. In yet another embodiment, the reference data set may be obtained through the use power log information of the processing of a substrate. That is, the reference data set may be measured data or calculated data.

In an embodiment, process 580 may continue with operation 585, which comprises using the thermal model to generate temperature sensor offsets and/or zone multipliers to apply to the reference data set in order to generate a target profile. For example, the existing recipe used to generate the reference data set may be modified by one or more temperature sensor offsets and/or one or more zone modifiers. The thermal model may use equation solvers in order to minimize non-uniformity for a given profile. For example, the thermal model may use any commercial solver solution to minimize the profile non-uniformity.

Figure 6A:
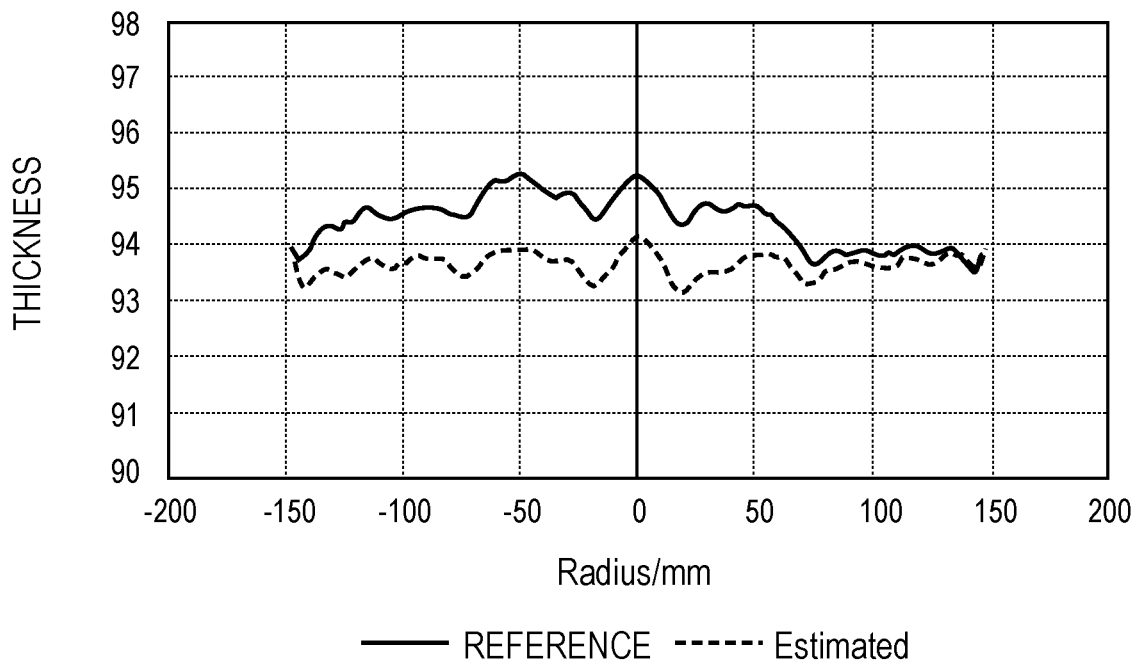
FIG. 6A is a graph of the thickness profile for a reference data set and an estimated data set generated by a thermal model, in accordance with an embodiment.

Referring now to FIG. 6A, a graph of the thickness across the radius of a substrate is shown for the reference data and an estimated thickness provided by the model. As shown, the reference data includes a larger range of thickness values across the diameter of the substrate than the estimated values. This reduces the non-uniformity and provides an improved outcome compared to the existing process recipe.

Figure 6B:
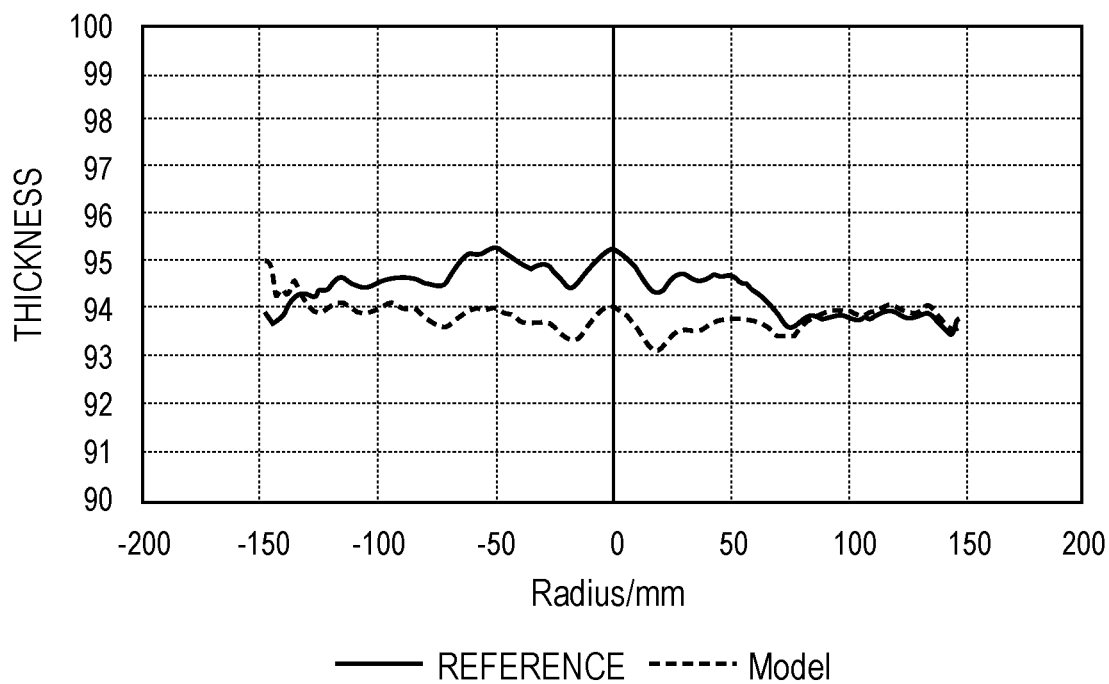
FIG. 6B is a graph of the thickness profile for the reference data set and the measured data after implementing the desired temperature offsets and zone multiplier offsets, in accordance with an embodiment.

Referring now to FIG. 6B, a graph of the thickness across the radius of a substrate is shown for the reference data and the updated process recipe. The model line is actual metrology data that has been obtained after running a substrate with the updated process recipe that includes the temperature offsets and/or the zone multipliers. As shown, the model line has a non-uniformity similar to the non-uniformity estimated in FIG. 6A. Accordingly, it is assumed that the thermal model was accurately able to improve the process recipe. Additionally, the thermal model may be used to modify the recipe to provide any desired profile type.

Figure 7:
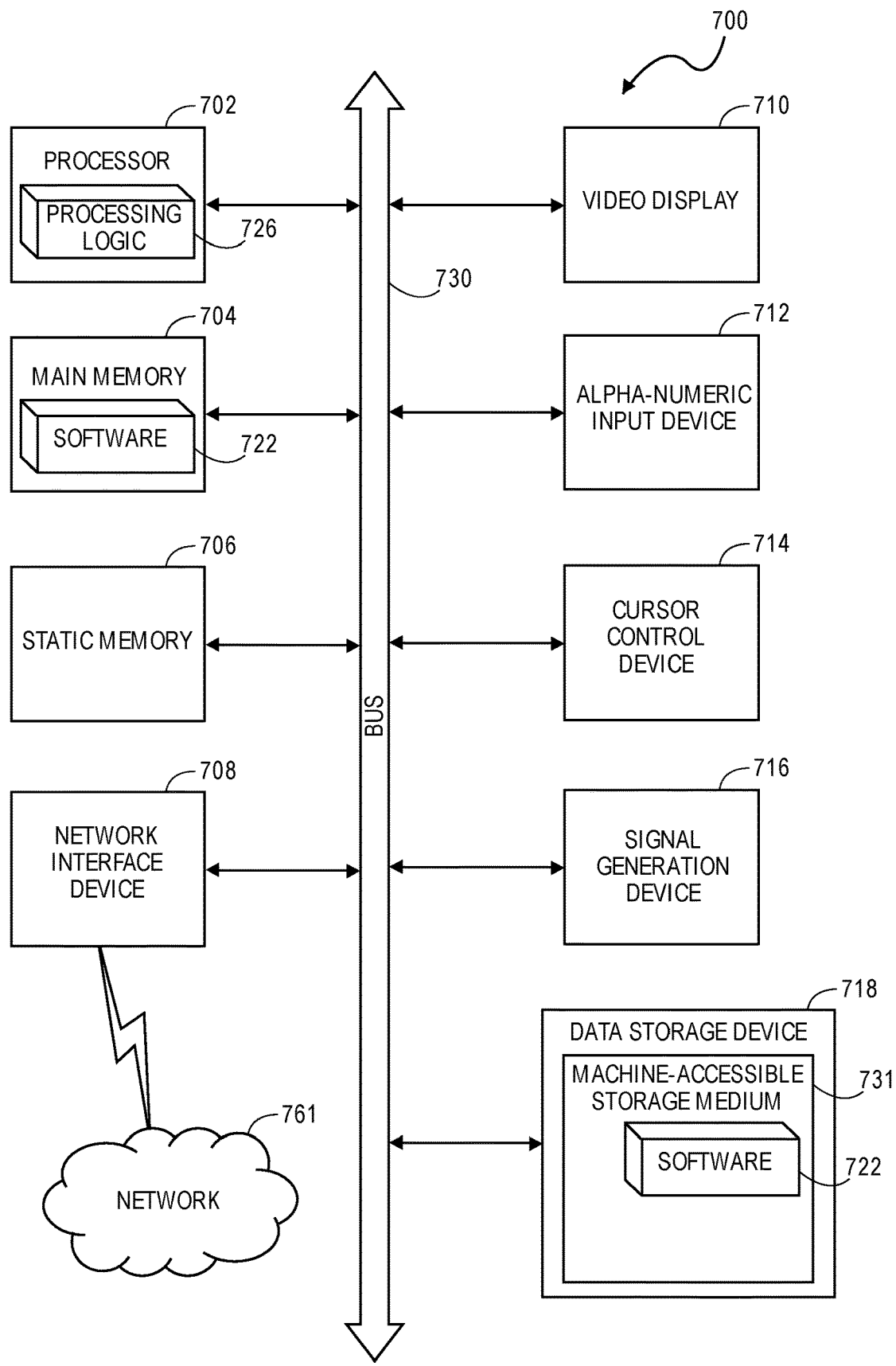
FIG. 7 illustrates a block diagram of an exemplary computer system that may be used in conjunction with a processing tool, in accordance with an embodiment.

Referring now to FIG. 7, a block diagram of an exemplary computer system 700 of a processing tool is illustrated in accordance with an embodiment. In an embodiment, computer system 700 is coupled to and controls processing in the processing tool. Computer system 700 may be connected (e.g., networked) to other machines in a Local Area Network (LAN), an intranet, an extranet, or the Internet. Computer system 700 may operate in the capacity of a server or a client machine in a client-server network environment, or as a peer machine in a peer-to-peer (or distributed) network environment. Computer system 700 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 700, the term "machine" shall also be taken to include any collection of machines (e.g., computers) that individually or jointly execute a set (or multiple sets) of instructions to perform any one or more of the methodologies described herein.

Computer system 700 may include a computer program product, or software 722, having a non-transitory machine-readable medium having stored thereon instructions, which may be used to program computer system 700 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 700 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 700 may further include a system network interface device 708 for communicating with other devices or machines. The computer system 700 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 700, the main memory 704 and the system processor 702 also constituting machine-readable storage media. The software 722 may further be transmitted or received over a network 761 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of setting a target profile, comprising:
obtaining a first gain curve for one or more temperature sensor offsets;
obtaining a second gain curve for one or more zone multipliers;
combining the first gain curve and the second gain curve into a thermal model;
obtaining a reference data set; and
using the thermal model to generate temperature sensor offsets and/or zone multipliers to apply to the reference data set in order to generate the target profile.

2. The method of claim 1, wherein the profile is an edge hot profile.

3. The method of claim 1, wherein the profile is an edge cold profile.

4. The method of claim 1, wherein the profile is a center flat profile.

5. The method of claim 1, wherein the first gain curve comprises temperature sensor offsets for three or more temperature sensors.

6. The method of claim 1, wherein the second gain curve comprises zone multipliers for four or more zones.

7. The method of claim 1, wherein a number of temperature sensors is less than a number of zones.

8. The method of claim 7, wherein a first temperature sensor measures a temperature of an area of a substrate that is controlled by more than one zone.

9. The method of claim 1, wherein the reference data set is obtained through metrology of a previously processed substrate.

10. The method of claim 1, wherein the reference data set is previously calculated values from the thermal model.

11. A method for setting a target temperature profile in a thermal processing chamber, comprising:
obtaining a first gain curve for one or more temperature sensor offsets of a plurality of temperature sensors;
obtaining a second gain curve for one or more zone multipliers for a plurality of lamp zones, wherein a number of zone multipliers is greater than a number of temperature sensors;
combining the first gain curve and the second gain curve into a thermal model;

obtaining a reference data set; and
using the thermal model to generate temperature sensor offsets and/or zone multipliers to apply to the reference data set in order to generate the target temperature profile.

12. The method of claim 11, wherein the temperature profile is an edge hot profile, an edge cold profile, or a center flat profile.

13. The method of claim 11, wherein the reference data set is obtained from metrology of a previously processed substrate.

* * * * *